(12) United States Patent
Dahl

(10) Patent No.: US 6,436,750 B1
(45) Date of Patent: Aug. 20, 2002

(54) METHOD OF FABRICATING INTEGRATED CIRCUITS HAVING TRANSISTORS AND FURTHER SEMICONDUCTOR ELEMENTS

(75) Inventor: Claus Dahl, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/645,765

(22) Filed: Aug. 25, 2000

(30) Foreign Application Priority Data

Aug. 25, 1999  (DE) ......................................... 199 40 317

(51) Int. Cl.$^7$ ......................................... H01L 21/8238
(52) U.S. Cl. ....................... 438/210; 438/238; 438/382; 438/596
(58) Field of Search ................................ 438/210, 238, 438/253, 275, 381, 382, 595, 596

(56) References Cited

U.S. PATENT DOCUMENTS 5,618,749 A * 4/1997 Takahashi et al. .......... 438/238
5,698,463 A * 12/1997 Suga ........................... 438/210
6,204,105 B1 * 3/2001 Jung ........................... 438/238

FOREIGN PATENT DOCUMENTS

EP           0880165        * 11/1998

* cited by examiner

Primary Examiner—Chandra Chaudhari
(74) Attorney, Agent, or Firm—Laurence A. Greenberg; Werner H. Stemer; Gregory L. Mayback

(57) ABSTRACT

Integrated transistors and other semiconductor elements are formed on a substrate. Spacers are applied for the purpose of producing LDD regions. A layer of polysilicon is first deposited in full-surface coverage and then removed except for spacers remaining on gate structures. The layer of polysilicon is utilized for the purpose of producing further integrated components and, for this purpose, is covered by an auxiliary layer and the latter in turn by an auxiliary mask. During the etching of the polysilicon layer, the structures covered by the auxiliary mask are preserved and can be utilized for further integrated components. The etching which is necessary for removing the spacers is effected selectively such that remaining structures of the auxiliary layer and thus of the underlying layer of polysilicon are not attacked. The components produced in addition are preserved. By slightly extending the process sequence for fabricating integrated transistors, a separate process block for fabricating the further integrated components is obviated.

19 Claims, 2 Drawing Sheets ion field. More
METHOD OF FABRICATING INTEGRATED CIRCUITS HAVING TRANSISTORS AND FURTHER SEMICONDUCTOR ELEMENTS

BACKGROUND OF THE INVENTION

FIELD OF THE INVENTION

The invention lies in the integrated technology field. More specifically, the invention relates to a method of fabricating an integrated circuit, in which semiconductor elements, in particular transistors of at least a first conductivity type, are fabricated with the aid of spacer technology on a substrate. In the process, a spacer material is applied and then partially etched back so that spacers remain. Then, a mask is placed and a first doping is introduced into the substrate, and the spacers are subsequently etched back.

Such methods are used for fabricating integrated circuits with a multiplicity of transistors or other switching elements in which spacers are temporarily produced in order, for example, to protect regions of the substrate surface which adjoin gate structures against a doping that is to be introduced. Transistors of CMOS technology, in particular, have lightly doped LDD regions in comparison with source and drain on both sides of the gate electrode, the regions being protected by spacers made, for example, of polysilicon during the doping of source and drain. After the spacers have been removed, the weaker doping for the LDD regions is introduced.

Integrated circuits have further semiconductor elements in addition to transistors and diodes. These include, in particular, passive components such as resistors and capacitors. Capacitors can be incorporated, by way of example, between two metallization planes. In that case only low-temperature dielectrics with a low breakdown field strength can be used. In analog or partly analog, partly digital integrated circuits, however, higher-quality capacitors having e.g. a thermal oxide as the dielectric and having electrodes made of polysilicon are required. Such capacitors can be fabricated during the patterning of the gate electrode of the transistors. In that case, the gate oxide layer simultaneously serves as the capacitor dielectric and the gate layer made of polysilicon simultaneously serves as the capacitor electrode. The second capacitor electrode is formed by the substrate. In those gate-substrate capacitors, however, the substrate potential is coupled to the potential of the gate electrode, resulting in considerable circuitry problems. Therefore, both electrodes are produced from polysilicon in higher-quality capacitors. In that case, the gate electrode made of polysilicon is utilized as the first capacitor electrode and e.g. the post-oxide (or a separately deposited insulator layer) situated thereabove is utilized as the dielectric. A second layer of polysilicon is deposited over that to fabricate the second capacitor electrode.

In technologies with a diffusion-doped gate layer, resistive tracks made of polysilicon can also be produced only with an additional layer made of polysilicon and subsequent doping, if the sheet resistivity is intended to be freely selectable. Conventional integrated circuits having, at least in part, analog functions are thus always fabricated in such a way that after the completion of the transistors or diodes, the capacitors and resistors are produced during additional process steps.

However, each additional process step leads to a considerable increase in the fabrication costs, and, in the face of these cost disadvantages, high-quality passive components made of polysilicon are frequently dispensed with.

In contrast with the technology disclosed in U.S. Pat. No. 5,391,906 and European patent application EP 880 165 A1, for instance, the present invention is based on the spacer technology as it is described for instance in Widmann: Technologie hochintegrierter Schaltungen [Technology of Large-Scale Integrated Circuits], Springer Verlag, 1996.

SUMMARY OF TEE INVENTION

The object of the invention is to provide a method of fabricating integrated circuits which overcomes the above-noted deficiencies and disadvantages of the prior art devices and methods of this kind, and which makes it possible to fabricate integrated circuits having active and passive components with the least possible additional outlay for the production of the passive components, under certain circumstances also of further active components.

With the above and other objects in view there is provided, in accordance with the invention, a method of fabricating an integrated circuit, wherein semiconductor elements, such as transistors, are formed on a substrate with the aid of spacer technology. The method comprises the following method steps:

applying a spacer material on a substrate;

covering the spacer material with an auxiliary layer and placing an auxiliary mask on the auxiliary layer;

partially etching back the auxiliary layer and the spacer material to form useful elements covered by the auxiliary layer and spacers and subsequently removing the auxiliary mask;

masking with a mask and introducing a first dopant into the substrate; and etching back the spacers selectively with respect to the auxiliary layer and the useful elements covered thereby.

The invention exploits the fact that polysilicon is already applied during the production of the spacers which are necessary for fabricating the transistors. The polysilicon has, however, hitherto been almost completely removed again by anisotropic etching. Only the spacers remaining at the gate edges are used for transistor fabrication.

The invention utilizes the spacer technology employed in the context of transistor fabrication. In this technology, spacer material is first applied and then partially etched back, so that spacers remain. The substrate is subsequently masked by a mask and a first doping is introduced. Afterwards, the spacers are etched back, that is to say removed.

According to the invention, the generic method is extended as follows: after the application of the spacer material, the latter is covered with an auxiliary layer; an auxiliary mask is applied to said auxiliary layer; the auxiliary layer is etched back at the locations which are not covered by the auxiliary mask, in the same way as spacer material is etched back, after which the auxiliary mask is removed again; and the spacers are etched back or removed selectively with respect to the auxiliary layer. Although the auxiliary layer used according to the invention is etched back at the locations which are not covered by the auxiliary mask, in the same way as the underlying spacer material is etched back, the structures made of spacer material which are produced through the auxiliary mask are nonetheless subsequently protected by the auxiliary layer during the process of completely and selectively etching back the spacers. As a result polysilicon structures remain after the removal of the spacers, and can be utilized for producing the high-quality capacitors and resistors. Additional process steps for applying layers after the completion of the transistors, in particular after the introduction of the dopings are no longer necessary. The layer structures required for the passive components are instead produced simultaneously in the context of the spacer technology employed. Moreover, with the aid of the polysilicon applied during the spacer deposition, it is possible to produce further active components, e.g. transistors with a thicker gate oxide.

With the method according to the invention, the process blocks for fabricating the transistors, on the one hand, and the passive components, on the other hand—the process blocks originally being carried out separately in time—are interwoven to form a single process block which, by comparison with the process block for fabricating the transistors, merely has three additional process steps, namely the application of the auxiliary layer, the application of the auxiliary mask and the removal of the auxiliary mask. The combination of these process steps with those which, in the context of transistor fabrication, can simultaneously be utilized for fabricating the passive components and the further transistors results in a short process sequence and thus a cost-effective method for fabricating analog or partly analog integrated circuits.

The method according to the invention is derived from a method for fabricating transistors, but it is not restricted to these components, rather is suitable for any application in which spacers or other dummy structures are produced, the material applied in order to produce them is firstly removed partially, that is to say except for the dummy structure, and later the dummy structure itself is likewise removed.

In the context of fabricating transistors of at least a first conductivity type, a preferred embodiment provides a further step of masking and introducing a weak, second doping, for the purpose of producing LDD regions.

In order to produce transistors of a second conductivity type, opposite to the first conductivity type, a further embodiment provides the additional steps of masking and introducing a third doping for the purpose of producing source and drain regions, etching back further spacers and also masking and introducing a weak; fourth doping for the purpose of producing further LDD regions. It is expediently provided that during the introduction of the first and/or third doping, in addition to the source and drain terminals, useful elements such as low-value resistors or capacitor electrodes are doped at the same time.

In accordance with a development of the invention, a weak doping for the purpose of producing high-value resistors is introduced into the applied auxiliary layer before the auxiliary layer is masked by the auxiliary mask.

An alternative embodiment provides for useful elements serving as high-value resistors to be doped at the same time during the doping steps for producing LDD regions.

Preferred embodiments provide for the spacers to be etched back anisotropically, for the spacer material to be polysilicon, for the auxiliary layer to be pervious to dopings, for the auxiliary layer to be a hard mask, preferably an oxide such as silicon oxide, and the mask to be a resist mask.

In accordance with the use of the generic method for fabricating transistors, further embodiments provide for initially a first gate oxide, a first gate layer and a further oxide, the so-called post-oxide, to be produced, and for the capacitors to be formed from the first gate layer, the post-oxide and the spacer material.

In accordance with another feature of the invention, further useful elements include gate layers of further transistors with a thicker gate oxide, which is composed of the first gate oxide, the post-oxide and the spacer material deposited.

In accordance with again another feature of the invention, the process of etching back the spacers is also effected selectively with respect to the post-oxide.

In accordance with a concomitant feature of the invention, it may be provided that during processing of the useful elements, a layer protected by a foundation layer located under the spacer material is covered laterally, and protected, by the spacers.

Other features which are considered as characteristic for the invention are set forth in the appended claims.

Although the invention is illustrated and described herein as embodied in a method for fabricating integrated circuits having transistors and further semiconductor elements, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
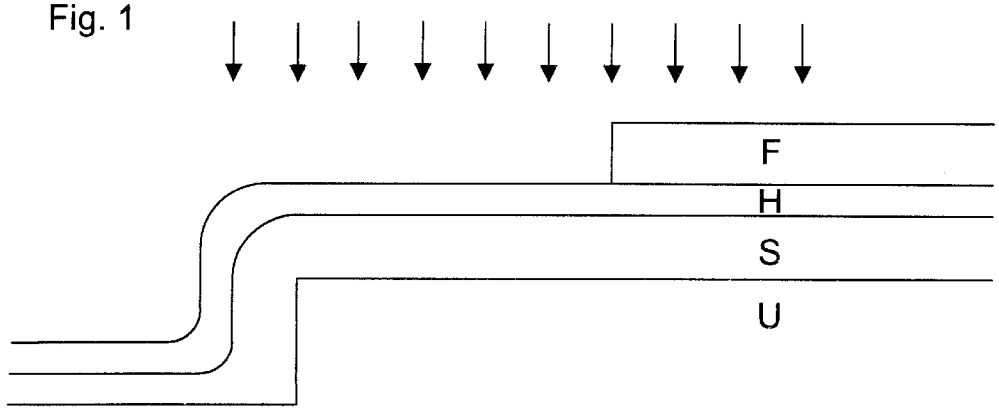
FIGS. 1 to 3 are diagrammatic side views of different method stages of the process according to the invention.

Referring now to the figures of the drawing in detail and first, particularly, to FIG. 1 thereof, there is seen a detail of an integrated semiconductor circuit U which has a step of the kind produced at the edge of gate structures. A substrate is covered in a full surface manner with a material S for producing spacers. According to the invention, the layer S is covered with an auxiliary layer H. An auxiliary mask F is applied for patterning purposes on the auxiliary layer H. During a first, anisotropic etching process, represented by vertical arrows, those regions of the auxiliary layer H and of the spacer material S which are not covered by the auxiliary mask F are removed except for spacers remaining on the steps. In the exemplary embodiment of a CMOS process that is described here, the spacers serve for producing a defined spacing between source/drain regions and the gate edges.

Figure 2:
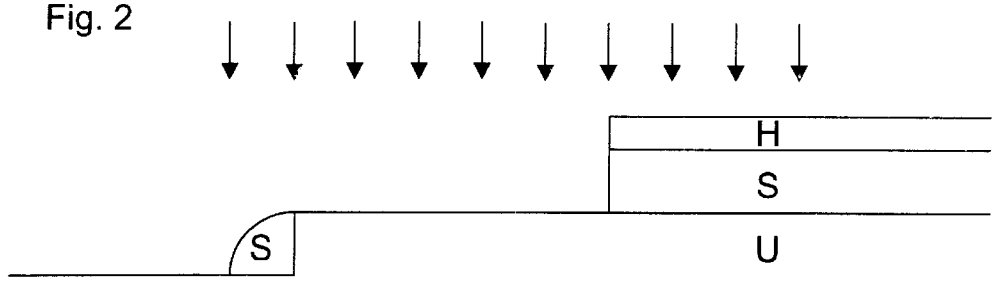
Figure 3:

Further useful elements remain by dint of the auxiliary mask F. These further useful elements are then freed of the auxiliary mask F, to produce the structure illustrated in FIG. 2. After they have fulfilled their purpose, the spacers S are removed by means of a second anisotropic etching process, in which the remaining useful elements are protected by the hard mask H. The resulting structure is illustrated in FIG. 3.

A variety of structures can be fabricated with the aid of the novel method. Some of those structures are placed next to one another in exemplary fashion in FIG. 4. With regard to the processing stage, FIG. 4 corresponds to FIG. 2.

Figure 4:
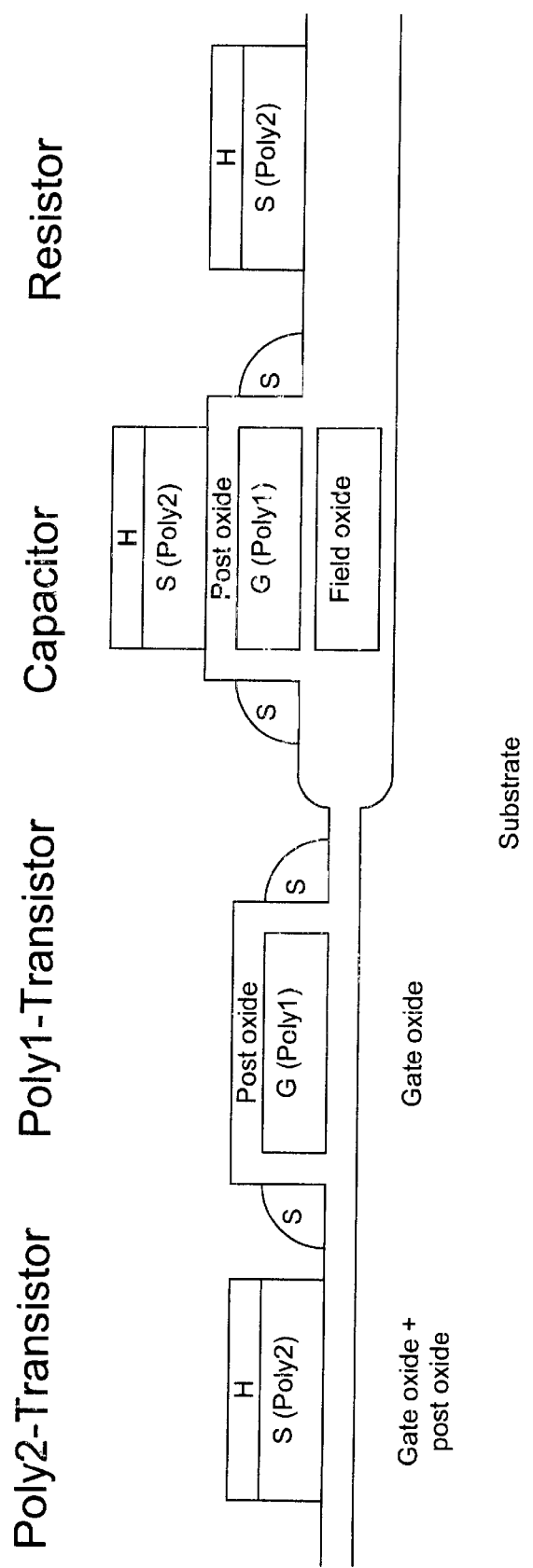
FIG. 4 is a diagrammatic overview—not exhaustive—of some of the components which can be fabricated with the aid of the novel method according to the invention.

In addition to the transistor which is fabricated in a conventional manner and whose gate layer G is formed by a first layer of polysilicon (Poly 1), FIG. 4 illustrates a capacitor, a resistor and a further transistor as useful elements which can be additionally fabricated according to the invention. These useful elements are those surface regions of the spacer layer S, originally applied over the whole area, which were still covered with the auxiliary mask F during the first anisotropic etching process. In the same way as the spacers themselves, they are composed of a second layer of polysilicon (Poly 2) and are initially still covered by the auxiliary layer H, which can be removed after the removal of the spacers with the aid of a second etching process, which is selected with respect to the auxiliary layer H. Since the auxiliary layer H is pervious to doping, the second layer of polysilicon may already be doped before the spacers are removed. In particular, low-value resistors, capacitor electrodes S as well as the gate layer S of the further transistor can be doped at the same time as the source and drain of the Poly 1 transistor. The slight doping required for high-value resistors is preferably already applied before the application of the auxiliary mask F to the spacer layer S applied in a full surface (whole-area) manner or through the auxiliary layer H lying above it.

The capacitor comprises a bottom electrode G produced at the same time as the gate structure of the Poly-1 transistor. The post-oxide surrounding said gate structure serves, applied equally to the bottom capacitor electrode G, as a dielectric, while the top capacitor electrode is formed from the spacer layer S. Furthermore, wherever gate oxide and post-oxide are not separated by the first polysilicon layer G, it is possible to fabricate a second transistor with a thicker gate oxide. The spacer layer S deposited in a whole-area manner is likewise used as the gate layer of such transistors.

Figure 5:
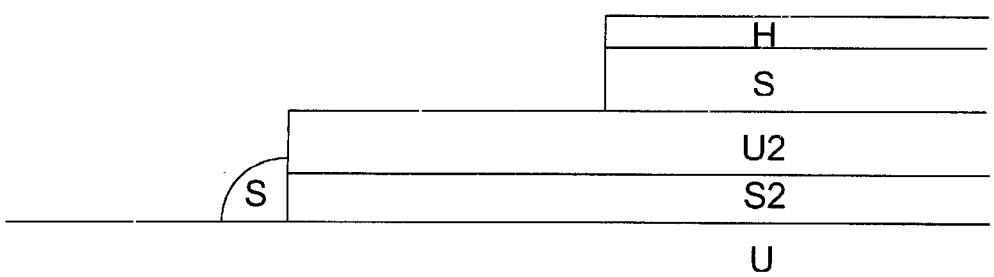
FIG. 5 is a diagrammatic side view of an exemplary embodiment with a layer that is covered and at times also protected laterally by spacers.

Referring now to FIG. 5, there is shown a structure in which the step of the foundation U is formed by a sequence of a plurality of layers S2 and U2. With regard to the method stage, FIG. 5 corresponds to FIG. 2, that is to say the step of the foundation and thus the layer S2 is still covered laterally by the spacer S. Therefore, in the case of such buried layers, too, method steps for processing the useful elements produced according to the invention can be carried out without these layers being attacked.

The active and passive components illustrated by way of example in FIG. 4 can be fabricated for instance by means of a CMOS process for fabricating analog circuits. In this case, the following process sequence results:

Firstly, field oxide structures are produced by means of customary LOCOS process steps. The gate oxide is subsequently produced by whole-area oxidation, the first layer of polysilicon being applied as gate layer on the gate oxide. After the gates have been patterned, they are surrounded by a post-oxide by means of further whole-area oxidation. Afterwards, a second layer of polysilicon is deposited for the purpose of producing the spacers. According to the invention, the auxiliary layer H, preferably deposited $SiO_2$, is now applied. The doping required for high-value resistors is expediently implanted in this method stage. Subsequently, according to the invention, the auxiliary mask, usually a resist mask produced by photolithography, is applied for the purpose of patterning the second polysilicon layer and then the layer sequence comprising polysilicon 2 and the oxidic auxiliary layer, that is to say the hard mask, is etched. The auxiliary mask F applied according to the invention is subsequently removed. The structures represented in FIG. 4 remain.

Afterwards, the substrate is masked lithographically and a dopant is implanted for the purpose of producing source and drain of n-channel transistors. According to the invention, the mask is configured in such a way that low-value resistors and capacitor electrodes are doped simultaneously during the implantation. The spacers of the n-channel transistors are subsequently removed by etching. This etching process is effected selectively with respect to the auxiliary layer H, with the result that the useful elements are not attacked. Moreover, the etching process is, of course, selective with respect to the post-oxide serving as a stop layer. After the spacers have been removed, the LDD regions of the n-channel transistors can be doped. The resist mask is subsequently removed and replaced by a new mask for the doping of the p-channel transistors. Source and drain of the p-channel transistors, and optionally also further useful elements that are to be doped heavily, are doped and then the spacers of the p-channel transistors are removed. This is followed by the doping of the LDD regions, and optionally also of further useful elements that are to be doped lightly, with the aid of further implantation. Finally, the second resist mask is also removed and the intermediate oxide and the metallization layers are applied.

This process sequence according to the invention corresponds to that of a CMOS digital process which has merely been extended by the steps of hard mask deposition, applying the auxiliary mask and removing the latter. It is advantageous for a doping for high-value resistors to be additionally implanted after the high mask deposition. In this way, high-value resistors are produced with the aid of a whole-area implantation, whereas low-value resistors are produced with the aid of lithographically patterned implantation.

It goes without saying that all of the etching steps for removing spacer material are selected with respect to the foundation, that is to say the post-oxide situated under the spacer material is not removed, but rather serves as a stop layer for the etching process. Since the second etching process for removing the spacers is at the same time effected selectively with respect to the auxiliary layer, separate lithography is not necessary for removing the spacers.

The useful layer S is expediently composed of polysilicon. If the auxiliary layer H is composed of the same material as the foundation U (for example $SiO_2$), the joint etching back of the auxiliary layer with the spacer material is carried out in two etching steps. In the first etching step, firstly only the auxiliary mask H is etched selectively with respect to the layer S; in the second step, the spacer material S is etched selectively with respect to the material of the foundation or the auxiliary layer H. The layer thicknesses of the spacer material and of the auxiliary layer depend on the topology of the foundation and the selectivities of the respective etching processes. With higher selectivity, the layer thicknesses can be varied increasingly freely.

It will be understood that the embodiments described herein are merely exemplary. Further implementations and embodiments emerge upon application of the knowledge and abilities of those of skill in the art.

I claim:

1. A method of fabricating an integrated circuit, in which semiconductor elements are fabricated using spacer technology on a substrate having a stage, which comprises the steps of:

applying a spacer material on a substrate;

covering the spacer material with an auxiliary layer and placing an auxiliary mask on the auxiliary layer;

etching back the auxiliary layer so as to form a residual auxiliary layer and etching the spacer material, whereby useful elements covered by the residual auxiliary layer remain, in addition to the spacers, in the stage;

removing the auxiliary mask;

introducing a first dopant into the substrate; and etching back the spacers selectively to the useful elements covered by the residual auxiliary layer.

2. The method according to claim 1, which further comprises masking and introducing a weak, second doping for producing LDD regions.

3. The method according to claim 2, which further comprises producing transistors of a second conductivity type, opposite a first conductivity type, by:

placing a mask and introducing a third doping for producing source and drain regions;

etching back further spacers; and placing a mask and introducing a weak, fourth doping for producing further LDD regions.

4. The method according to claim 3, wherein the step of introducing the third doping further comprises simultaneously doping other useful elements.

5. The method according to claim 4, wherein the other useful elements are selected from the group consisting of low-value resistors and electrodes of capacitors.

6. The method according to claim 1, which comprises, after applying the auxiliary layer and prior to the step of partially etching back, introducing a weak doping into the spacer material for producing high-value resistors.

7. The method according to claim 2, which comprises doping useful elements serving as high-value resistors at the same time as the LDD regions.

8. The method according to claim 1, wherein the spacers are etched back anisotropically.

9. The method according to claim 1, wherein the spacer material is polysilicon.

10. The method according to claim 1, wherein the auxiliary layer is formed of a material pervious to dopings.

11. The method according to claim 1, wherein the auxiliary layer is a hard mask made of an oxide.

12. The method according to claim 11, wherein the hard mask is formed of silicon dioxide.

13. The method according to claim 1, wherein the mask is a resist mask.

14. The method according to claim 1, which comprises, prior to placing the spacer material on the substrate, producing a first gate oxide, a first gate layer, and a post-oxide.

15. The method according to claim 14, which comprises forming capacitors from the first gate layer, the post-oxide, and the spacer material.

16. The method according to claim 14, which further comprises forming further useful elements in the form of gate layers of further transistors with a thicker gate oxide composed of the first gate oxide, the post-oxide, and the spacer material deposited in the applying step.

17. The method according to claim 14, wherein at least one of the steps of etching back the spacers is also selective with respect to the post-oxide.

18. The method according to claim 1, wherein the spacers are formed to laterally cover and to protect a layer protected by a foundation layer located underneath the spacer material, during a processing of the useful elements.

19. The method according to claim 1, which comprises forming transistors of a defined conductivity type with the aid of the spacers on the substrate.

* * * * *